(12) United States Patent
Prada et al.

(10) Patent No.: US 8,548,762 B2
(45) Date of Patent: Oct. 1, 2013

(54) METHOD OF ESTIMATING THE NON-MEASURABLE CHARACTERISTICS OF AN ELECTROCHEMICAL SYSTEM

(75) Inventors: Eric Prada, Lyons (FR); Valérie Sauvant-Moynot, Lyons (FR)

(73) Assignee: IFP Energies Nouvelles, Rueil-Malmaison (FR)

( * ) Notice: Subject to any disclaimer, the term of this patent is extended or adjusted under 35 U.S.C. 154(b) by 524 days.

(21) Appl. No.: 12/869,547

(22) Filed: Aug. 26, 2010

(65) Prior Publication Data

US 2011/0054816 A1 Mar. 3, 2011

(30) Foreign Application Priority Data

Sep. 2, 2009 (FR) ..................................... 09 04159

(51) Int. Cl.
*G01R 31/36* (2006.01)
*G06F 11/30* (2006.01)

(52) U.S. Cl.
USPC ................. 702/63; 702/64; 702/65; 702/182; 702/183

(58) Field of Classification Search
USPC ....................... 702/63–65, 121–123, 182–188
See application file for complete search history.

(56) References Cited

U.S. PATENT DOCUMENTS

| 6,016,047 A * | 1/2000 | Notten et al. ................. 320/137 |
| 6,037,777 A | 3/2000 | Champlin |
| 6,191,590 B1 | 2/2001 | Klütz et al. |
| 6,778,913 B2 | 8/2004 | Tinnemeyer |
| 2002/0120906 A1 * | 8/2002 | Xia et al. ........................... 716/2 |
| 2005/0189948 A1 | 9/2005 | Koch |
| 2007/0035307 A1 | 2/2007 | Schoch |

FOREIGN PATENT DOCUMENTS

| EP | 0 880 710 B1 | 8/2004 |
| EP | 1 562 049 A1 | 8/2005 |
| EP | 1 835 297 A1 | 9/2007 |
| WO | WO 2007/090843 A2 | 8/2007 |
| WO | WO 2009/130405 A2 | 10/2009 |

OTHER PUBLICATIONS

Sauer, Dirk Uwe: "Modelling of Local Conditions in Flooded Lead/Acid Batteries in Photovoltaic Systems," Journal of Power Sources, vol. 64, No. 1-2, pp. 181-187, Jan. 1, 1996, Elsevier SA, CH LNKD—DOI:10.1016/S0378-7753(96)02519-0, XP004075209, ISSN: 0378-7753.

(Continued)

*Primary Examiner* — Phuong Huynh
(74) *Attorney, Agent, or Firm* — Antonelli, Terry, Stout & Kraus, LLP.

(57) ABSTRACT

The present invention relates to a method of estimating the internal state of an electrochemical system by a zero-dimensional (0D) electrochemical mathematical model for estimating the characteristics of a battery that are not directly measurable during operation thereof. For applications relating to hybrid and electric vehicles, the most significant internal characteristics are the state of charge (SoC), the state of health (SoH) and the thermal state (T). Reconstruction of the internal characteristics is achieved using a mathematical model of the battery. The method can be used with the operation of the battery itself (real time) with a concentrated-parameter (0D) or off-line mathematical model, for calibration, an optimization or a validation of management and estimation strategies. The method allows simulation of the thermal and electrical behavior of a battery. The method according to the invention can also be useful for battery dimensioning and for optimization of the energy and thermal management strategies as a function of the desired application.

25 Claims, 7 Drawing Sheets

(56) References Cited

OTHER PUBLICATIONS

Gerschler, Jochen Bernhard et al: "High-Spatial Impedance-Based Modeling of Electrical and Thermal Behavior of Lithium-ion Batteries—A Powerful Design and Analysis Tool for Battery Packs in Hybrid Electric Vehicles," Electric Vehicle Symposium (EVS 23), Dec. 5, 2007, pp. 1/17 Slides 1/32, XP 2578596, Anaheim, USA, URL:http://www.isea.rwth-aachen.de/publications/pdf/274492804bd6d779a565leed557ce25c6fb09741>.

* cited by examiner

METHOD OF ESTIMATING THE NON-MEASURABLE CHARACTERISTICS OF AN ELECTROCHEMICAL SYSTEM

CROSS-REFERENCE TO RELATED APPLICATIONS

Reference is made to U.S. patent application Ser. No. 12/919,721, entitled "System for Smart Management of an Electrochemical Battery," filed on Aug. 26, 2010 and to U.S. patent application Ser. No. 12/919,731, entitled "Method of Estimating the Non-Measurable Characteristics of an Electrochemical System," filed on Aug. 26, 2010, which applications are incorporated herein by reference in their entirety.

BACKGROUND OF THE INVENTION

1. Field of the Invention

The present invention relates to a method of estimating the characteristics of an electrochemical system such as a battery, that are not directly measurable.

2. Description of the Related Prior Art

The electrochemical battery is one of the most critical components of a hybrid or electric vehicle. Sizing of the battery within the vehicle architecture is based on a simulation of the battery that precisely represents its electrical and thermal behavior at various dynamic load levels. Proper operation of the vehicle is based on a smart battery management system (BMS) whose purpose is to operate the battery with the best compromise between the various dynamic load levels. Precise and reliable knowledge of the state of charge (SoC), the state of health (SoH) and the thermal state (T) is essential for the BMS.

The state of charge (SoC) of a battery is the available capacity thereof (expressed as a percentage of its nominal capacity). Knowing the SoC allows estimation of how long the battery can continue to supply energy at a given current or how long it can absorb energy. This information conditions the operation of the entire vehicle and notably the management of the energy among its components.

Performance of a battery during its life degrades gradually due to the physical and chemical variations that occur during use, until the battery becomes unusable. The state of health (SoH), which is the available capacity after recharging (expressed in Ah), thus is a measurement of the point that has been reached in the life cycle of the battery.

The thermal state (T) of a battery conditions its performances because the chemical reactions and transport phenomena involved in the electrochemical systems are thermally activated. The initial thermal state is linked with the temperature external to the vehicle, which can be led to operate within a wide temperature range, typically between −40° C. and +40° C. The thermal state during operation evolves depending on the battery draw under charge and discharge conditions, its design and its environment.

More precise and reliable estimation of the SoC, the SoH and the thermal state T thereof consequently involves several advantages. This estimation helps prevent the vehicle supervisor from functioning too conservatively regarding use of the energy potential of the battery or inversely. It also allows avoiding safety oversizing of the battery and therefore saving on-board weight and, consequently, consumed fuel and it also allows reduction of the total cost of the vehicle. A correct estimator thus guarantees efficient and reliable use of the battery capacity over the entire operating range of the vehicle.

The SoC estimation method referred to as "Coulomb counting" or "book keeping" is known, but it leads to estimation errors by disregarding phenomena such as self-discharge.

No-load voltage measurement as a SoC indicator is also known. Use of other indicators for the estimation of internal resistance is disclosed in U.S. Pat. No. 6,191,590 and EP Patent 1,835,297.

The latter two methods are characterized by the fact that the SoC is first associated with one or more measurable or easily assessable quantities, through static mappings or analytical functional dependencies. However, these dependencies are in fact much more complicated than what is taken into account in the BMS, which often leads to SoC estimation errors.

A potentially more promising method is based on the measurement, by impedance spectroscopy (EIS), of a physical quantity parametrized by the SoC. For example, U.S. Published Application 2007/0090843 suggests determining the frequency $f_\pm$ associated by EIS with the capacitive/inductive transition. A correlation between frequency $f_\pm$ and the SoC is presented for a lead battery, for Ni—Cd batteries and Ni-MH batteries.

A similar approach is based on modelling the EIS spectra by equivalent electric circuits whose components are parametrized by the SoC, as described in U.S. Pat. No. 6,778,913 filed by the Cadex Electronics Company to provide an automotive battery tester Spectro CA-12 based on the multi-frequency electrochemical impedance spectroscopy for the acid-lead pair. The EIS spectra are approximated by equivalent electric circuits and the evolution of the components is parametrized by the SoC. Similarly, U.S. Pat. No. 6,037,777, filed by K. S. Champlin, determines the state of charge and other battery properties by measuring the real and imaginary parts of the complex impedance or admittance for lead batteries or other systems.

An alternative approach is based on mathematical battery models using estimation techniques known in other fields. In general terms, there are two main categories of models of the electrical and thermal behavior of batteries allowing simulation electrochemical system which are on the one hand, the electrochemical models inspired by Newman's work, based on the knowledge of the chemical reactions and the physical-chemical phenomena that take place on a microscopic scale in the battery cell and on the other hand, the models with equivalent electric circuits, using electric elements such as resistors, capacities, inductances, arranged in series and/or in parallel, to best represent the behavior dynamics of a battery.

Modelling the behavior of batteries by electric analogy is the commonest procedure because such models are intuitive ones, with concentrated parameters (that is, depending only on time), which procedure does not have time consuming calculations. The electric elements, most often identified by a physical measurement, are parametrized by the SoC, the state of health SoH, the temperature T and the value of the current (given in form of mappings).

U.S. Published Patent Application 2007/0,035,307 notably describes a method of estimating the state variables and the parameters of a battery from operating data (voltage U, current I, T), using a mathematical battery model. The mathematical model comprises a plurality of mathematical submodels which provide faster response. The submodels are models of equivalent electric circuit type, referred to as RC models, associated with restricted frequency ranges.

The use of RC models is also described in EP Patent 0,880,710 (Philips), including the description of the electrochemical and physical phenomena at the electrodes and in the electrolyte serving as a support for the development of the RC model. The temperature of the battery is simulated by the model in order to gain precision in relation to an external measurement.

In the models of RC type, the SoC is always introduced only to parametrize other variables. The SoC itself is never mentioned as an electrochemical variable. The prediction accuracy of the models by electric analogy depends on the experimentally established mappings, with a limited number of tests. These models therefore often have difficulty accounting precisely for the battery dynamics under nominal and extreme operating conditions, under high or zero current involving relaxation phenomena in the battery spread over several hours before return to thermodynamic equilibrium is voided.

In the electrochemical models, the equations of the kinetics of the main electrochemical reactions, complemented by the mass and charge balances on the scale of an element, constitute a system of algebraic-differential equations whose solution gives, at any time, the concentration of the active species. The SoC is defined from the concentrations of the active species at the electrodes.

Another SoC estimation method known in the literature (Gu, White, etc.) is based on the mathematical description of the reactions of an electrochemical system. The SoC is calculated from state variables of the system. This description rests on material, charge, energy balances and on semi-empirical correlations. The French patent application Ser. No. 08/01,709, filed on 28 Mar. 2008, entitled "METHOD OF ESTIMATING THE NON-MEASURABLE CHARACTERISTICS OF AN ELECTROCHEMICAL SYSTEM," corresponding to U.S. Ser. No. 12/919,721, is based on the mathematical description of the reactions of an electrochemical system allowing obtaining a reference model, and then to derive therefrom a reduced model of the behavior of the battery from the reference model. However, the charge redistribution and relaxation phenomena in the battery, after more than twenty (20) seconds, are always disregarded.

Surprisingly enough, it has been found that a method comprising a mathematical description of the reactions of an electrochemical system directly in form of a 0D model (that is based on a "zero-dimensional" approximation, as detailed below) accounts for the dynamic behavior of a battery under high current and under zero current, with increased precision, synchronously with the operation of the battery, and it also allows more fine estimation of the non-measurable internal characteristics of an electrochemical system.

SUMMARY OF THE INVENTION

The present invention relates to a method of simulating the behavior and of estimating the internal state of a rechargeable electrochemical system such as a battery, from a concentrated-parameter (zero-dimensional) mathematical model of the battery, which can be advantageously used synchronously with the operation of the battery itself (real time). In particular, in order to reconstruct the internal state of the battery from measurements readily obtained conventionally, the method notably allows estimation of the SoC, the SoH and the thermal state T of an electrochemical battery, which are the most significant internal characteristics for applications relative to hybrid and electric vehicles, but which values are not directly measurable.

The method of the invention allows management of an electrochemical battery, during its operation in a hybrid or electric vehicle. The method according to the invention also simulates the thermal and/or electrical behavior of a battery. The method can also be useful off-line, notably for battery sizing and for optimization of the energy and thermal management strategies as a function of the desired application.

The method according to the invention can be used for:
on-board control and energy management of a hybrid or electric vehicle,
a simulator of the electrical and thermal behavior of a battery, for example within the context of sizing of a battery for a given application, calibration, optimization or validation of the energy and thermal management strategies of the battery, and
a battery charger/discharger.

The invention also relates to a smart system for energy and thermal management of the battery during operation thereof.

The invention thus relates to a method of estimating the internal state of a rechargeable electrochemical system (such as battery) comprising electrodes, a separator and an electrolyte, wherein at least one input signal of at least one parameter representative of a physical quantity of the system is available and wherein an electrochemical model of the system is established, comprising at least:
a mathematical representation accounting for interface concentrations and kinetics of electrochemical reactions occurring at the interfaces between each electrode and the electrolyte; a mathematical representation of a spatial accumulation of charges in double layer capacity at each electrode;
a mathematical representation of a redistribution of charges at the electrode;
a mathematical representation of diffusion of ionic charges of the electrolyte through the electrodes and the separator;
a material balance in all the electrodes and electrolyte of the system; and
an energy balance of the system for calculating a temperature of the electrochemical system.

According to the invention, the electrochemical model is a model with concentrated parameters wherein the parameters are homogeneous within the electrodes and the separator, and the internal state of the system is estimated by generating at least one output signal by applying the model to the input signal.

According to an embodiment, the electrochemical model accounts for aging of the electrochemical system by determining a maximum concentration decrease for the species stored in the electrodes and an increase in an internal resistance of the electrochemical system.

Maximum concentration decrease $[X]_{max}$ can be determined by the formula:

$$\frac{d}{dt}[X]_{max} = -\chi_{electrode}|J_{para,z}|$$

wherein $\chi_{electrode}$ is a functional quantity characteristic of materials that make up each electrode, t represents time and $|J_{para,z}|$ represents a parasitic charge transfer current density for a reaction z.

Internal resistance increase $R_{layer}$ can be determined by the following formula:

$$\frac{d}{dt}R_{layer} = \pm\chi_{layer}|J_{para,z}|$$

wherein $\chi_{layer}$ is a functional quantity characteristic of a chemical composition of parasitic layers formed at the surface of the electrodes by reactivity with the electrolyte, sign +/− depends on the physico-chemical mechanism of surface layer development, t represents time and $|J_{para,z}|$ represents a parasitic charge transfer current density for a reaction z.

According to the invention, the rechargeable electrochemical system can also comprise a compartment for collecting gaseous species, and the parameters are homogeneous within the compartment.

The interface concentration and the mean concentration $C=f(t)$ can be distinguished for each active species in each region of the electrochemical system.

The thermodynamic equilibrium potential of each electrode can be described by a thermodynamic mathematical relation, for example the Nernst, Margules, Van Laar, Redlich-Kister equations, or by an analytical relation, for example polynomial, exponential, or other.

The input signal of at least one parameter representative of a physical quantity of the rechargeable electrochemical system can be intensity I and/or potential V and/or temperature T and/or the required electric power.

At least one of the following signals can be recorded as an output signal: the potential, the state of charge, the state of health, and the temperature of the electrochemical system.

The voltage at the terminals of the electrochemical system and the temperature of the electrochemical system can be recorded as an output signal.

The state of charge, the state of health, and the temperature of the electrochemical system can be recorded as an output signal.

The invention also relates to a system for smart management of an electrochemical battery, comprising:

an input means connected to a measuring means of the battery, for receiving an input value of at least one parameter representative of a physical quantity of the battery;

a processing means, including at least one processor, for generating at least one output signal of at least one characteristic calculated by the method according to the invention described above' an information/control means for providing information on the physical quantity of the battery and/or controlling charge/discharge and/or cooling of the battery in response to the output signal of the processing means.

The processing means of the management system according to the invention can comprise a recursive filter.

The management system can be used for energy control and management of a hybrid or electric vehicle, or of a photovoltaic or a wind powered energy plant.

The management system can be used for control and management of a charger/discharger of a hybrid or electric vehicle, a photovoltaic or a wind powered energy plant.

The invention also relates to a simulator of the thermal and/or electrical state of a battery, comprising:

an input means for receiving an input value of at least one parameter representative of a physical quantity of a battery;

a processing means, including at least one processor, for generating at least one output characteristic calculated by the method described above.

The method according to the invention can be used for an impedance spectroscopy simulator.

The method can be used for simulating the thermal and electrical behavior of a traction battery of a hybrid or electric vehicle, or of a photovoltaic or eolian energy plant.

The method can also be used for sizing a battery.

The 0D electrochemical model used in the method according to the invention, referred to as "concentrated-parameter model," is based on the assumption that the concentrations of the species and the other variables are homogeneous in each region of the electrochemical system corresponding typically to the electrodes, the separator and the compartment for collect the gaseous species. It is a zero-dimensional (0D) homogeneous approximation.

In the zero-dimensional homogeneous approximation, the variables therefore only depend on time. A pseudo-1D approach is used within the active matter that make up the electrode materials to account for the diffusion aspects in the solid phase.

The 0D electrochemical model of the method according to the invention can calculate the variations over time of all the electrochemical variables internal to the battery, and in particular of the state of charge. Since one of the inputs of the model is the current at the battery terminals, the simulated cases depend on the selection of the latter variable.

The quantities that can be used as input signals of the model are, in the case of an electrochemical battery: intensity I, temperature T, potential V, or the electric power required from the storage system.

Advantageously, the interface concentration and the mean concentration $C=f(t)$ are distinguished for each active species in each region of the electrochemical system.

Advantageously, the thermodynamic equilibrium potential of each electrode is described by a thermodynamic mathematical (Nernst, Margules, Van Laar, Redlich-Kister) or analytical relation (polynomial, exponential, . . . ).

The potential and/or the state of charge and/or the state of health and/or the temperature of the electrochemical system is recorded as an output signal.

Advantageously, for an application of the method to a battery simulator, the output voltage at the output terminals of the electrochemical system and the temperature output of the electrochemical system are recorded.

Advantageously, for an application of the method to a battery state estimator, the output state of charge, the output state of health and the output temperature of the electrochemical system are recorded.

The invention also relates to a system for smart management of an electrochemical battery (notably referred to as Battery Management System BMS), comprising:

an input means. connected to a measuring means of the battery, for receiving an input value of at least one parameter representative of a physical quantity of the battery;

a processing means, including at least one processor, for generating at least one output signal of at least one characteristic calculated by the method using a 0D electrochemical model according to the invention;

an information/control means for providing information on a physical quantity of the battery and/or controlling charge/discharge and/or cooling of the battery in response to the output signal of the processing and/or a comparison means.

The processing means can comprise a recursive filter (for example, of the Kalman type).

The management system can be used for on-board control and energy management of a hybrid vehicle.

The invention comprising the management system also relates to a battery charger/discharger.

The invention further relates to a battery simulator comprising:

an input means for receiving an input value of at least one parameter representative of a physical quantity of a battery; and a processing means, including at least one processor, for generating at least one output characteristic calculated by the method according to the invention.

The battery simulator notably allows simulation of the thermal and electrical behavior of the battery.

The invention also relates to an impedance spectroscopy simulator using the method according to the invention.

The method according to the invention allows implementation of a battery sizing and/or design process.

The invention also relates to a simulator of the hybrid or electric vehicle system comprising a traction battery, using the method according to the invention for estimating the internal characteristics of the battery.

DETAILED DESCRIPTION OF THE INVENTION

Figure 1:
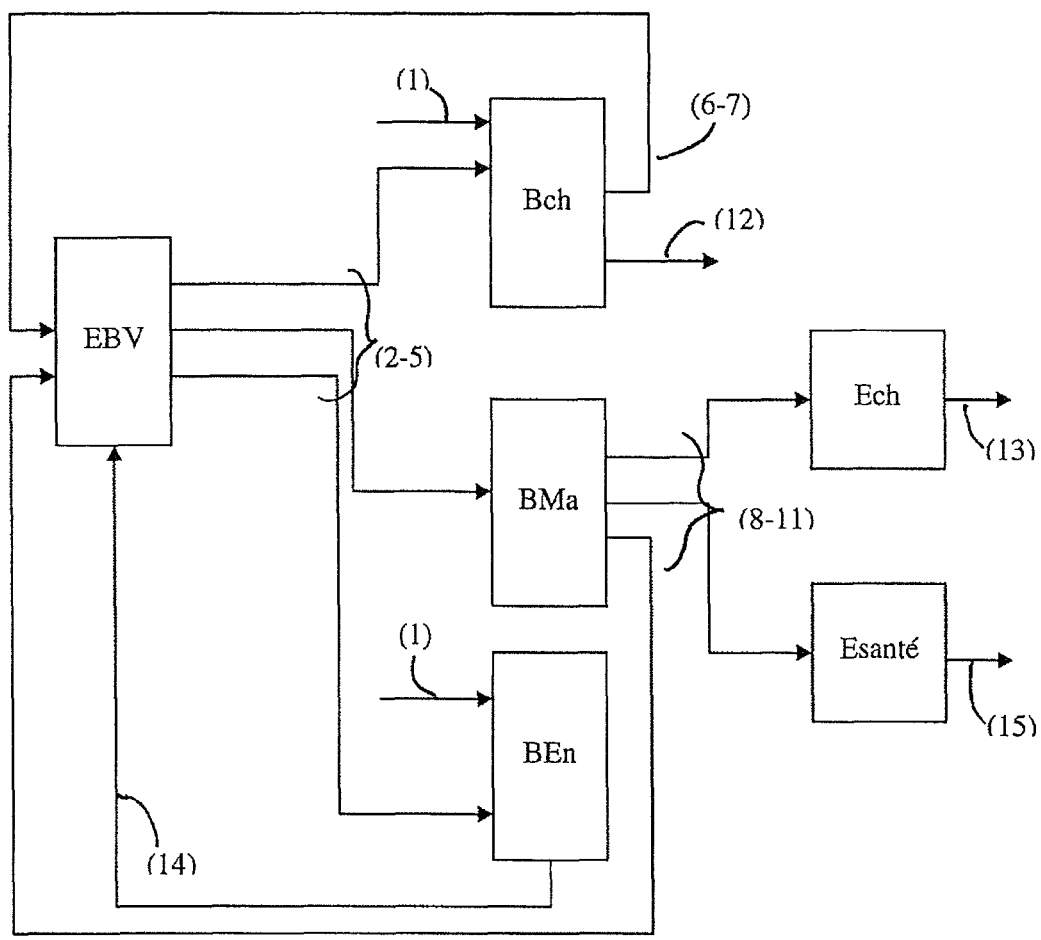
FIG. 1 shows a model according to the method of the invention.

FIG. 1 diagrammatically shows the model according to the method of the invention. The references have the following meaning:

EBV is a processor for calculating the Butler-Volmer equations (Equation 2) that describe the kinetics of the electrochemical reactions;

(1): $I_{app}$ is the current applied to the cell;
(2): $J_z$ is the current density for chemical reaction z;
(3): $J_{z+k}$ is the current density for chemical reaction z+k;
(4): $J_{z+k+1}$ is the current density for chemical reaction z+k+1;
(5): $J_n$ is the current density for chemical reaction n;

Bch is a processor for calculating the charge balance representing the equations of the electric charge balance;

(6): $\phi_{pos}$ is the overpotential at the interface of the positive electrode material;
(7): $\phi_{neg}$ is the overpotential at the interface of the negative electrode material;

BMa is a processor for calculating the material balance representing the material balance and mass conservation equations;

(8): $[X]°_{pos}$ is the surface concentration of species X at the positive electrode;
(9): $[X]°_{neg}$ is the surface concentration of species X at the negative electrode;
(10): $[X]_{z,pos,max}$ is the maximum concentration of species X in the positive electrode;
(11): $[X]_{z,neg,max}$ is the maximum concentration of species X in the negative electrode;
(12): V is the potential at the terminals of the electrochemical cell;
(13): SoC is the state of charge of the battery (State of Charge);

Ech is the state of charge representing all the equations giving the state of charge of the system;

Esanté is the state of health representing all the equations giving the state of health of the system;

BEn is a processor for calculating the energy balance representing all the equations giving the evolution of temperature as a function of the thermal fluxes Phi generated during operation of the battery;

(14): T is the temperature of the system;
(15): SoH is the state of health of the battery (State of Health).

The current at the cell terminals is considered as an input of the model, whereas the voltage is one of its outputs. The input signals, current and temperature, are representative of physical quantities measured on the battery. Processing means, using processors EBV, Bch, BMa and BEn, based on Butler-Volmer's equations, calculate the charge balance, the material balance, the energy balance and the state of the battery on the basis of the input signals and they generate output signals derived from the calculation, such as the potential, the state of charge, the state of health and the temperature.

Figure 2:
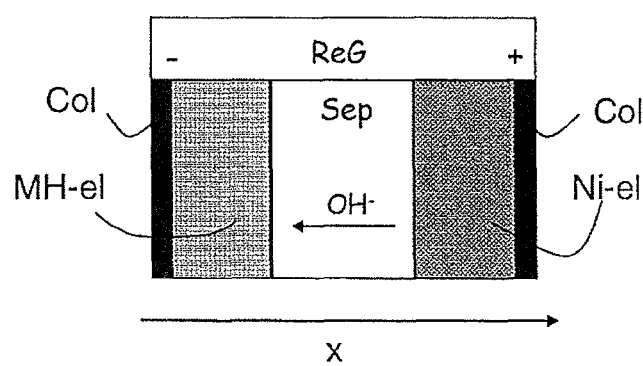
FIG. 2 shows a Ni-MH battery cell.

FIG. 2 diagrammatically shows a Ni-MH battery cell where MH-el designates the metal hydride-based porous negative electrode, Ni-el is the nickel-based porous positive electrode, ReG is the gas reserve compartment, and Sep is the separator insulating electrically the two electrodes, Col are the two current collectors and x is the prevalent direction. In order to guarantee ionic conduction between the two electrodes when there is a current flow, the electrodes and the separator are impregnated with a concentrated alkaline solution. The gas (oxygen or hydrogen) that can be released during charging of the battery is concentrated in a common space ReG above the cells.

Figure 3:
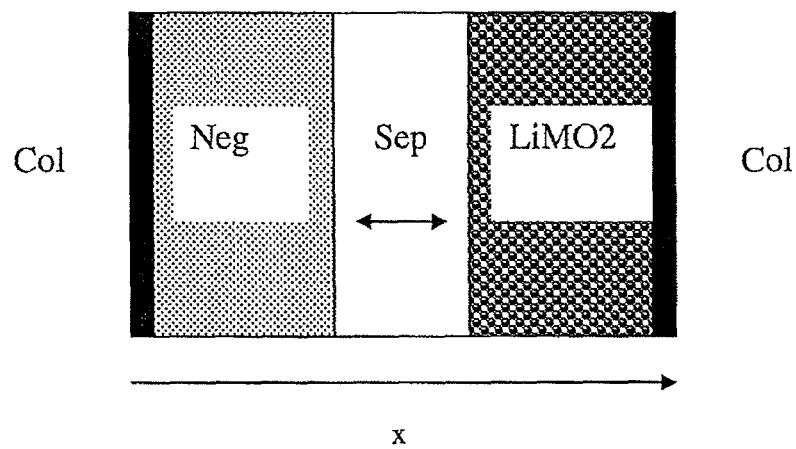
FIG. 3 shows a Li-ion battery cell.

FIG. 3 diagrammatically shows a Li-ion battery cell where Neg designates the carbon compound-based porous negative electrode, LiM02 is the metal oxide-based porous positive electrode, Sep is the separator insulating electrically the two electrodes, Col are the current collectors and x is the prevalent direction. In order to guarantee ionic conduction between the two electrodes when there is a current flow, the electrodes and the separator are impregnated with a lithium salt-concentrated organic electrolyte.

Figure 4:
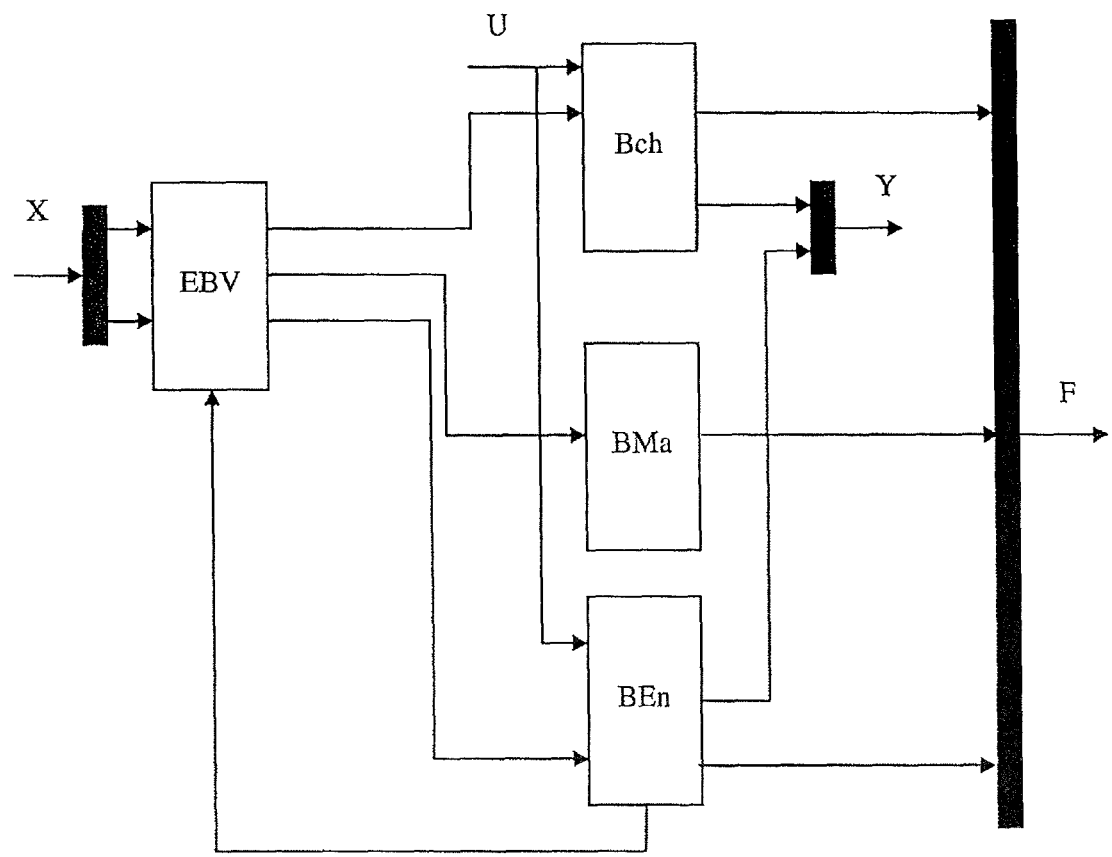
FIG. 4 shows a Kalman filter applied to an electro-chemical cell according to the method of the invention.

FIG. 4 diagrammatically shows the Kalman filter that is applied to an electrochemical cell according to the method of the invention, with X being the internal state calculated by the estimator, U being the input, Y being the output, and F being variation of the internal state according to the model.

Figure 5:
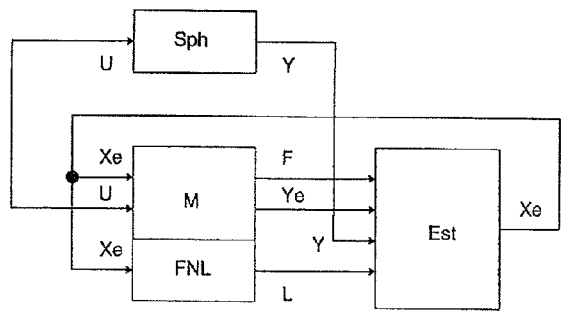
FIG. 5 is a flowsheet of the SoC estimator algorithm of the invention.

FIG. 5 is a flowsheet of the SoC estimation algorithm, with Sph being the physical system, M being the model, FNL being the non-linear filter, Est being the estimator, U being the measured inputs, Y being the measured outputs, Ye being outputs calculated by the model, Xe being internal state calculated by the estimator, F being variation of the internal state according to the model and L being the gain at the non-linear filter output.

Figures 6A, 6B, 6C, 6D:
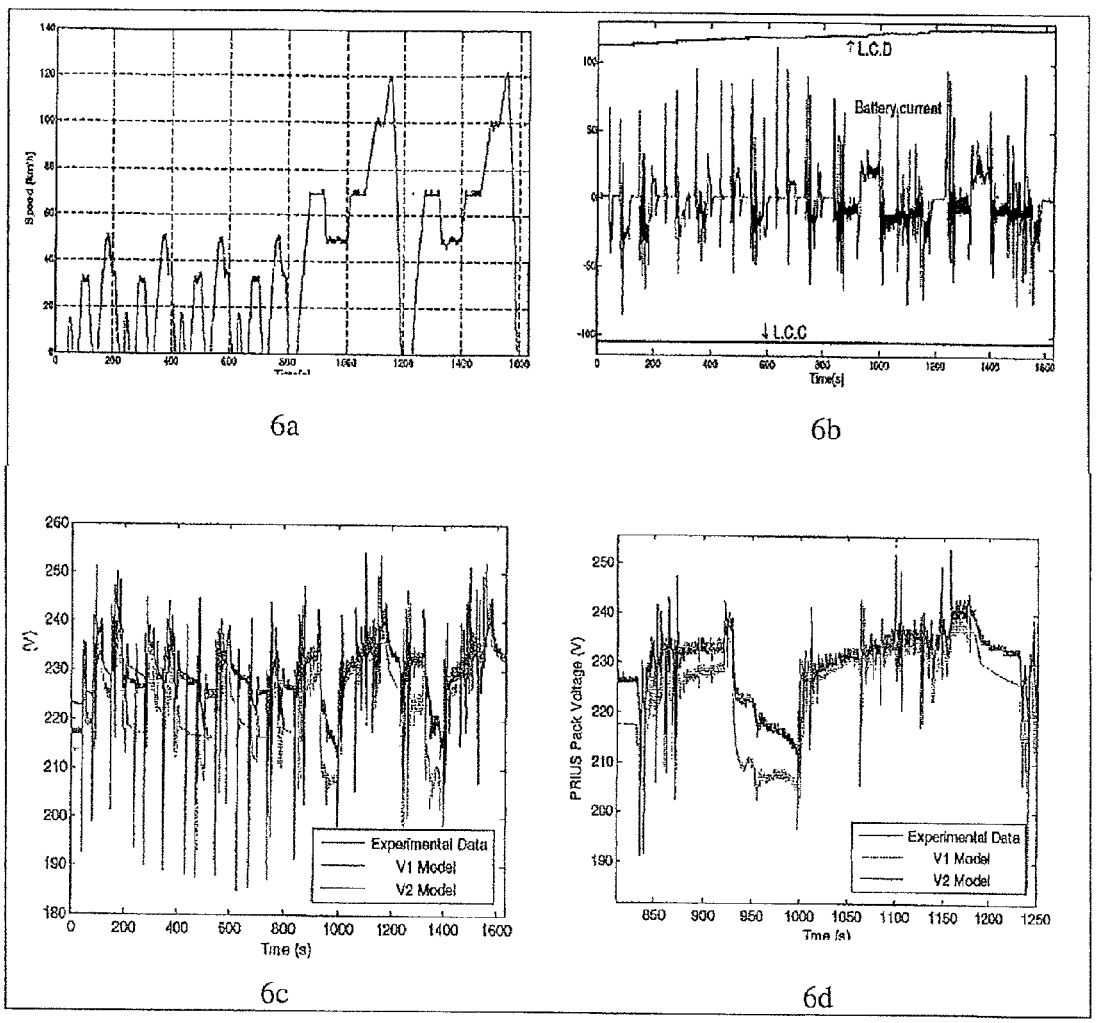
FIGS. 6a, b, c and d show an example of voltage prediction according to a reduced model of the invention.

FIGS. 6a, b, c, d show an example of voltage prediction of the reduced model according to the invention from a Ni-MH 6.5 Ah battery manufactured by the Panasonic Company, used at ambient temperature according to a dynamic current regime corresponding to a road profile. The simulated results are compared with the experimental measurements and with the simulations according to the prior art. FIG. 6a gives the evolution of speed (ordinate) as a function of time T (abscissa) on a given driving profile. FIG. 6b gives the variation of the battery current as a function of the driving profile. FIG.

6c shows the comparison between the simulated voltages from a model V1 of the prior art and model V2 according to the invention, and the experimental measurements. FIG. 6d is an enlargement of FIG. 6c, between time interval 850 and 1250.

Figures 7A, 7B, 7C, 7D:
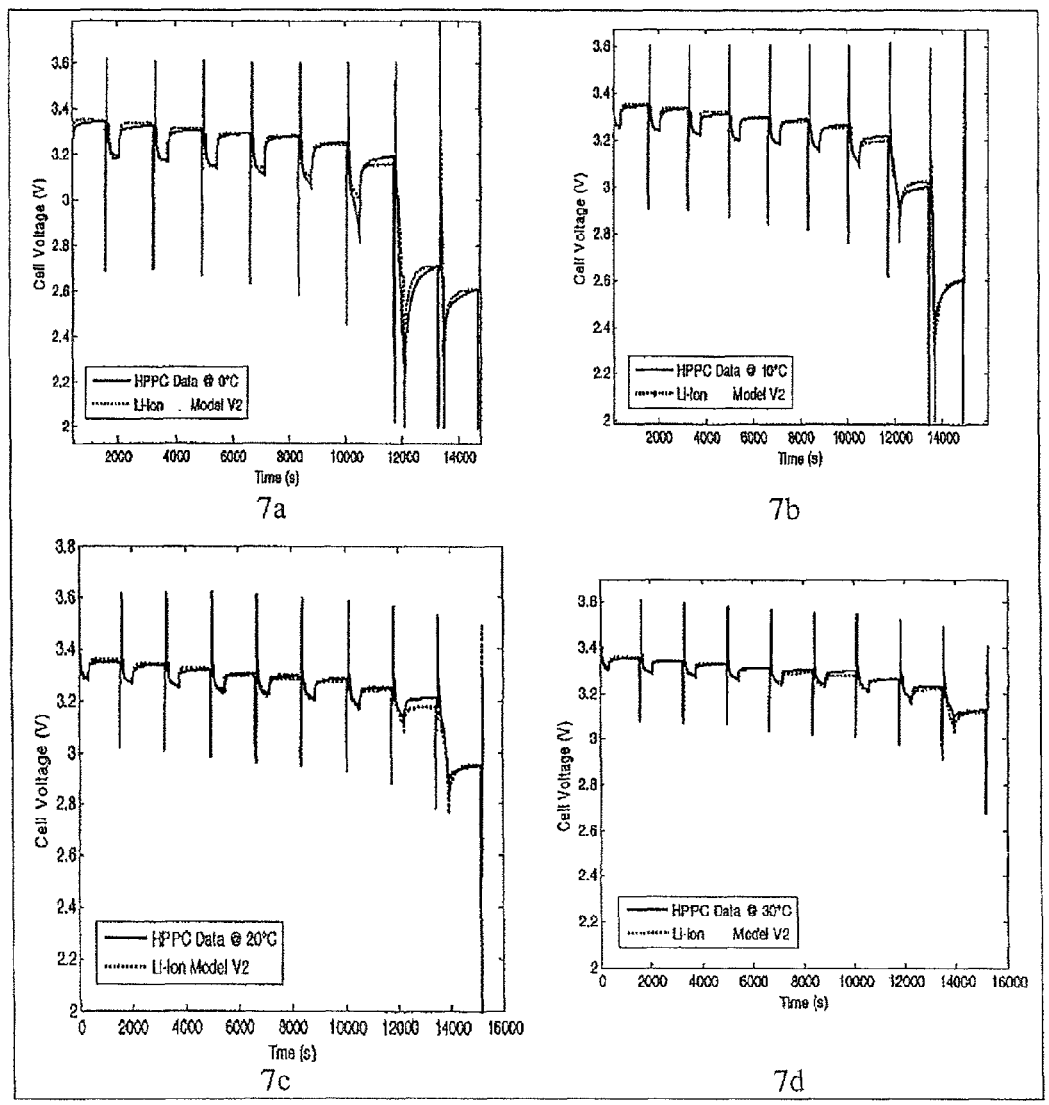
FIGS. 7a, b, c and d show an example of voltage prediction of the reduced model according to the invention.

FIGS. 7a, b, c, d show an example of voltage prediction of the reduced model according to the invention for a Li-ion 2.3 Ah battery manufactured by A123s, used at different temperatures (0° C., 10° C., 20° C., 30° C. respectively in FIGS. 7a, 7b, 7c and 7d) according to a dynamic current regime corresponding to a HPPC profile. The results simulated by model V2 according to the invention are compared with the experimental results.

Figures 8A, 8B, 8C, 8D:
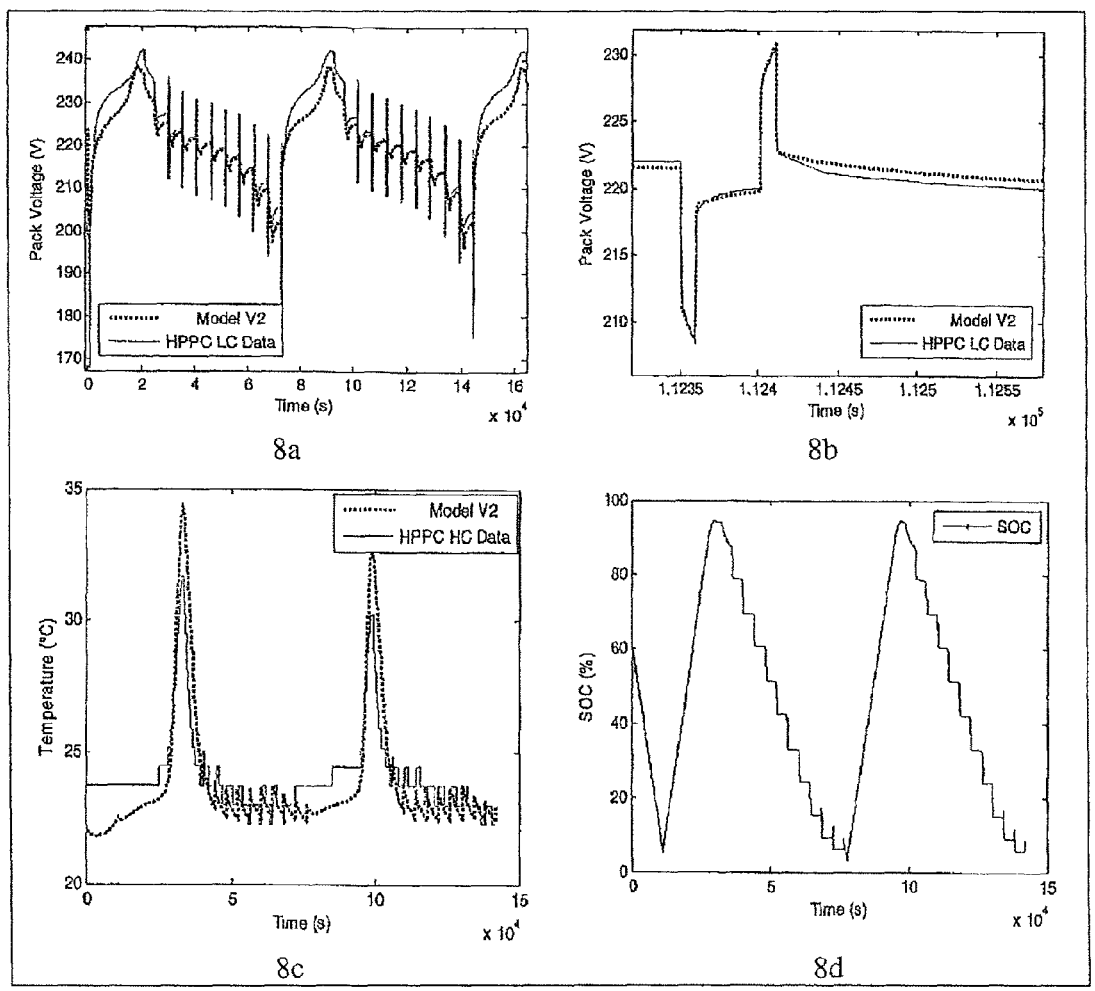
FIGS. 8a, b, c and d show an example of temperature prediction of the reduced model according to the invention.

FIGS. 8a, b, c and d show an example of temperature prediction of the reduced model according to the invention for a Ni-MH 6.5 Ah battery manufactured by Panasonic, used at ambient temperature according to a dynamic current regime corresponding to a HPPC profile. The results simulated by model V2 are compared with the experimental results In FIGS. 8a, 8b and 8c. FIG. 8a shows the evolution of the voltage of the battery as a function of time between 0% and 110% SoC. FIG. 8b is an enlargement of a phase of FIG. 8a, over a 50% SoC power discharge/charge peak phase followed by relaxation (zero current). The charge and discharge peaks correspond to powers of approximately +5.5 kW and −7.5 kW. FIG. 8c shows the evolution of the temperature of the battery as a function of time. FIG. 8d provides the evolution of the state of charge on the HPPC HC profile.

Figures 9A, 9B, 9C:
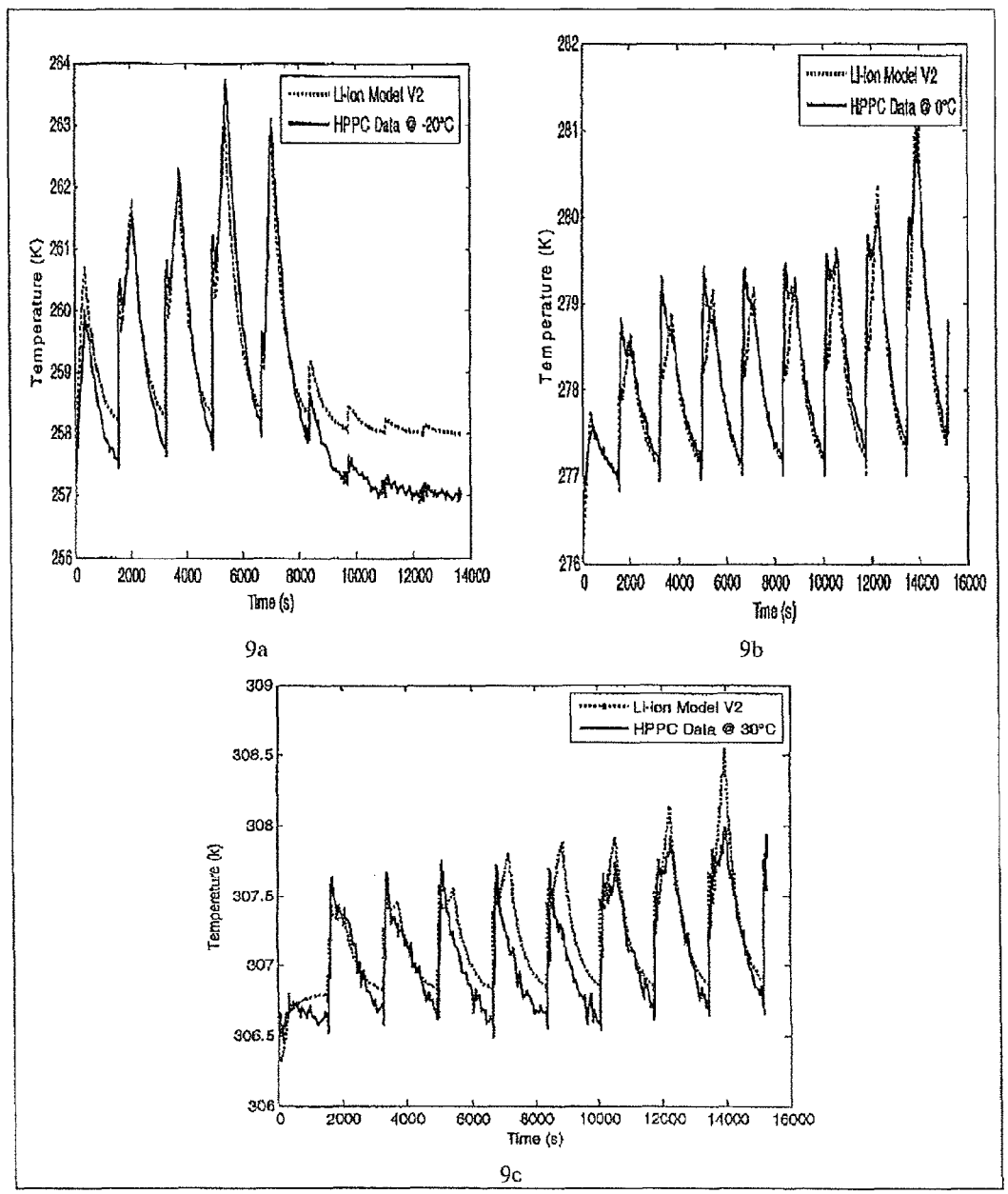
FIGS. 9a, b and c show an example of temperature prediction of a V2 model according to the invention.

FIGS. 9a, b and c show an example of temperature prediction of model V2 according to the invention for a Li-ion 2.3 Ah battery manufactured by A123s, used at different temperatures according to a dynamic current regime corresponding to a HPPC profile. The results simulated by V2 are compared with the experimental measurements. FIGS. 9a, 9b and 9c respectively correspond to temperatures of −20° C., 0° and 30° C.

Figure 10:
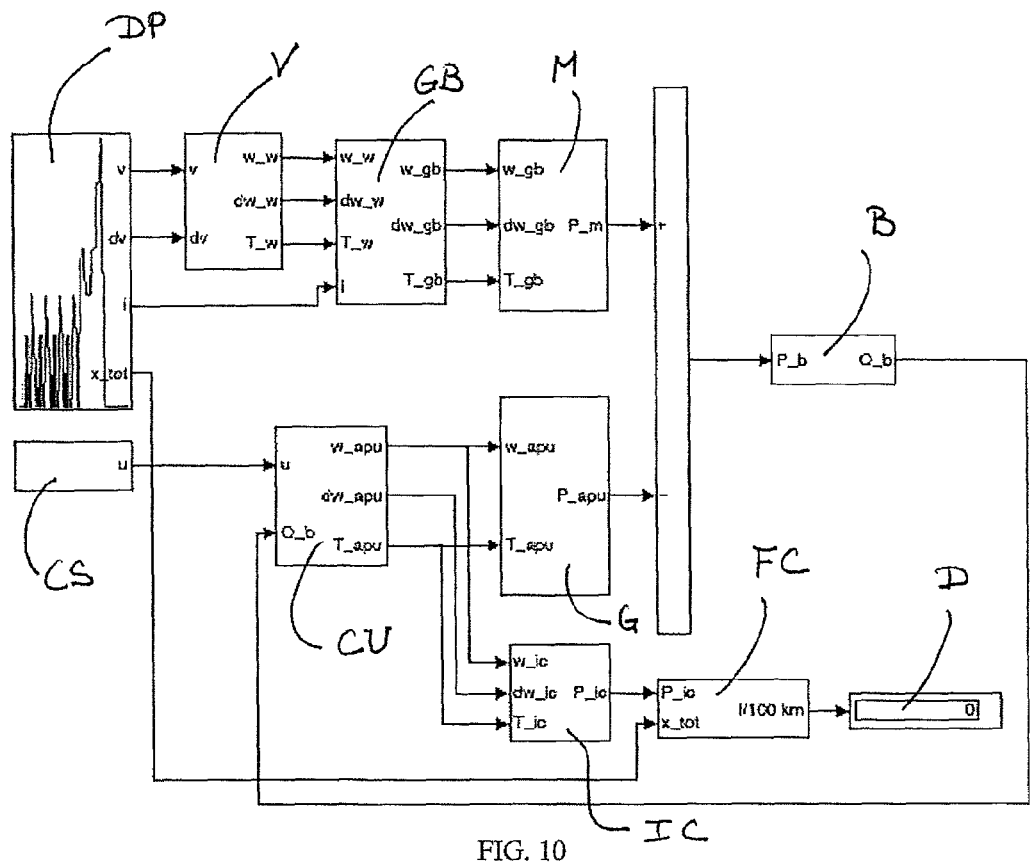
FIG. 10 shows a flowsheet of a hybrid vehicle simulator using the internal characteristic method according to the invention.

FIG. 10 is a flowsheet of a hybrid vehicle simulator using the internal characteristics estimation method according to the invention, wherein DP represents the driving profile, CS is the control strategy, V is the vehicle, GB is the gear box, M is the motorization, B is the battery, CU is the control unit, G is the generator, IC is the injection system, FC is the fuel consumption and D is the display.

Figure 11:
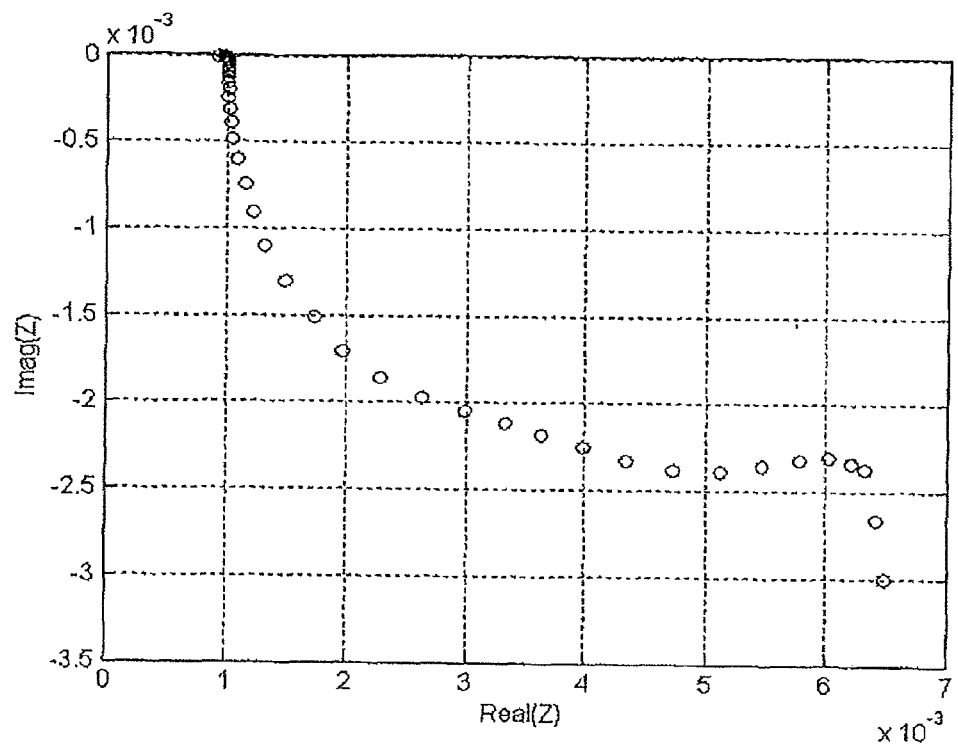
FIG. 11 shows an example of an electrochemical impedance spectroscopy curve simulated from the method according to the invention.

FIG. 11 shows an example of an electrochemical impedance spectroscopy curve simulated from the method according to the invention, representing the imaginary part of the impedance Imag(Z) (ordinate) as a function of the real part of the impedance Real(Z) (abscissa).

0D Electrochemical Model

As described above, the concentrated-parameter 0D electrochemical model is based on the assumption that the concentrations of the species and the other variables are homogeneous in each region of the electrochemical system (of the battery cell for example) corresponding typically to the electrodes, the separator and the compartment for collecting the gaseous species. This is referred to as zero-dimensional (0D) homogeneous approximation.

The equations for the implementation of the zero-dimensional model used in the method according to the invention are made explicit hereafter.

Electrochemical reactions take place at the interfaces between the electrodes and the electrolyte. The positive electrode is the seat of electrochemical reactions of reduction of the oxidizing species, during discharge, whereas the negative electrode is the seat of reactions of oxidation of the reducing species. The generalized equation of the electrochemical reactions between Reactive R and Produced P species is presented in relation (1):

$$\sum_{i=1}^{N} r_i R_i + ne^- \underset{\leftarrow ox}{\overset{red \rightarrow}{\rightleftharpoons}} \sum_{j=1}^{N^*} p_j P_j \qquad (1)$$

The kinetics of the electrochemical reactions can be described by Butler-Volmer's equations, whose general form for the generic reaction "z" is:

$$J_{ins,z}(t, T) = \qquad (2)$$

$$J_{z,0} \left\{ \frac{\prod_{j=1}^{N'} [P_j]_t^{op,j}}{\prod_{j=1}^{N'} [P_j]_{ref}^{op,j}} \exp(\alpha_{ox,z} nK\eta_z(t)) - \frac{\prod_{i=1}^{N} [R_i]_t^{ori}}{\prod_{i=1}^{N} [R_i]_{ref}^{ori}} \exp(-\alpha_{red,z} nK\eta_z(t)) \right\}$$

$$\exp\left(\frac{E_{a,z}}{R}\left(\frac{1}{T} - \frac{1}{T_0}\right)\right)$$

Where $\eta_z = \phi_{z,electrode} - U_{eq,z} - \phi_{layer,z}$ (3)

wherein $J_{ins,z}$ is the charge transfer current density (insertion), $J_{z,0}$ is the electronic exchange current density, $[X]°$ is the concentration of species X produced (P) or consumed (R) at the surface of an electrode material particle, $\eta_z(t)$ is the electrode overvoltage defined as the electrical potential difference at the immediate electrode/electrolyte interface between $\phi_{z,electrode}$ which is the potential at the electrode considered, $U_{eq,z}$ is the thermodynamic equilibrium potential and $\phi_z$ is a term of additional overvoltage due to the possible presence of a charge accumulation layer at the surface of the active matter grains. K is a function of temperature T and T0 is the reference temperature (298 K) (K=F/RT), and $E_{a,z}$ is the activation energy of the electrochemical reaction being considered.

Thermodynamic equilibrium potential $U_{eq,z}$ can take the form of complex mathematical expressions described by the Nernst, Margules, Van Laar or Redlich-Kister laws. These expressions are parametrized as a function of the rate of progress of the electrochemical reaction within the electrode and they can also take the form of polynomial, exponential, or hyperbolic mathematical functions. The hysteresis phenomena at the electrodes, if there are any, are taken into account by Equation (4):

$$\frac{dU_{eq,z}}{dt} = (U_{eq,z,\infty} - U_{eq,z}) \cdot k(I_{app}) \cdot |I_{app}| \qquad (4)$$

$$k(I_{app}) = \begin{cases} kc, & I_{app} > 0 \\ kd, & I_{app} < 0 \end{cases}$$

$$U_{eq,z,\infty} = \begin{cases} Ueq, z, c, & I_{app} > 0 \\ Ueq, z, d, & I_{app} < 0 \end{cases}$$

wherein subscripts c and d are relative to the charge and discharge processes respectively.

Material Balance

Electrical energy storage in electrochemical energy occurring during a reaction z is modelled by the general electrochemical kinetics equations presented above and of a material balance that takes the form of a differential equation between the charge transfer current density and the volume concentration of an electrochemical species X within an electrode material particle according to Equation (5):

$$\frac{d}{dt}[X] = -\beta_{electrode} J_{ins,z} \qquad (5)$$

wherein $\beta_{electrode}$ is a functional quantity characteristic of the electrode material and homogeneous with a diffusion length.

In order to determine the surface concentration $[X]^0$ of an electrode material particle, a linear type pseudodiffusional relation is used to account for the displacement of species X in the electrode material particles from the volume concentration of species X according to Equation (6):

$$[X]^0 - [X] = -J_{ins,z} \times \psi_{electrode} \frac{1}{D_{s,z}} \qquad (6)$$

wherein $\psi_{electrode}$ is a functional quantity characteristic of the electrode material and proportional to a diffusion length, $D_{s,z}$ is the diffusion coefficient of species X in the electrode material.

Charge Balance

Mathematical representation of the accumulation of charges in electrical double layers at each electrode in the 0D electrochemical model:

By taking into account the accumulation of the charges at each electrode, the method according to the invention extends the validity domain of the 0D electrochemical model to the non-stationary cases, where capacitive effects at the solid-liquid interfaces are significant such as, for example, the "double layer effect". Equation (7) retranscribes the taking account of the double layer capacity in the charge balance:

$$\frac{d\phi_{z,electrode}}{dt} = \Delta_{electrode}(\varepsilon_{electrode} I_{app} - J_z) \qquad (7)$$

where $\Delta_{electrode}$ is a functional quantity characteristic of the electrode considered where the electrochemical reaction z involving active species X takes place. $I_{app}$ is the current applied to the storage system and $\varepsilon_{electrode}$ a functional quantity characteristic of the electrode considered. $J_z$ is the total current density passing through the electrode considered and it is the sum of the insertion current $J_{ins,z}$ and of secondary $J_{secondaire,z}$ or parasitic $J_{para,z}$ reaction currents of the aging process type.

Mathematical representation of the charge redistribution at each electrode in the 0D electrochemical model:

The phenomenon of charge redistribution in the depth of each electrode is taken into account in the general 0D electrochemical model by Equations (8)-(10):

$$\frac{d\Delta\Phi_{z,electrode}}{dt} = g_{electrode}(I_{app}, J_z) - h_{electrode} V_{Rp,electrode} \qquad (8)$$

$$g_{electrode}(I_{app}, J_z) = \theta_{electrode}(I_{app} - \xi_{electrode} J_z) \qquad (9)$$

$$\frac{dV_{Rp,electrode}}{dt} = \frac{d\Delta\Phi_{z,electrode}}{dt} - k_{electrode} V_{Rp,electrode} \qquad (10)$$

wherein $g_{electrode}$ is a linear mathematical function involving the applied current $I_{app}$, as well as the charge transfer current density, and where $V_{Rp,electrode}$ is the charge redistribution overpotential in the depth of the electrode considered and $h_{electrode}$, $\theta_{electrode}$, $\xi_{electrode}$, and $k_{electrode}$ are functional quantities characteristic of the electrode material considered.

Mathematical representation of the ionic diffusion in the porosity at each compartment of the system in the 0D electrochemical model:

The generic 0D electrochemical model retranscribes the phenomenon of diffusion of the charges of the electrolyte in the porosity of the various compartments of the electrochemical system by integrating in the global electrical balance concentration overvoltage terms $\eta_{ci}$ that take the form of differential equation (11):

$$\forall i \in N, \frac{d\eta_{ci}}{dt} = \lambda_i(T)(I_{app} - \omega_i(T)\eta_{ci}) \qquad (11)$$

wherein $\lambda_i$ and $\omega_i$ are exponential mathematical functions characteristic of the storage system and reflecting the diffusive aspects in the short and long term. These functions depend on the temperature to account for the thermally activated conventional character of the process of diffusion of the species in presence. Generally, two overvoltage terms are sufficient to account for the diffusive phenomena.

Aging of the Energy Storage Systems:

Aging of the energy storage systems is characterized by a capacity loss (energy loss) accompanied by an increase in the internal resistance and the overvoltages (power loss), often caused by one or more parasitic aging reactions. The kinetics of the aging reactions can be described by a mathematical expression analogous to Equation (2), given in Equation (12):

$$J_{para,z}(t, T) = J_{para,z,0}$$

$$\left\{ \frac{\prod_{j=1}^{N'}[P_j]_t^{Op_j}}{\prod_{j=1}^{N'}[P_j]_{ref}^{Op_j}} \exp(\alpha_{ox,z} nK\eta_z(t)) - \frac{\prod_{i=1}^{N}[R_i]_t^{Or_i}}{\prod_{i=1}^{N}[R_i]_{ref}^{Or_i}} \exp(-\alpha_{red,z} nK\eta_z(t)) \right\}$$

$$\exp\left(\frac{E_{a,z}}{R}\left(\frac{1}{T} - \frac{1}{T_0}\right)\right) \qquad (12)$$

wherein $J_{para,z}$ is the parasitic charge transfer current density and $J_{para,z,0}$ is the electronic exchange current density of the parasitic reaction z.

The capacity loss is translated into a decrease in the maximum concentration of the species stored in the electrode material according to Equation (13):

$$\frac{d}{dt}[X]_{max} = -\chi_{electrode}|J_{para,z}| \qquad (13)$$

wherein $\chi_{electrode}$ is a functional quantity characteristic of the electrode material.

The power loss is translated into an increase in the internal resistance of the system, caused notably by the growth of resistive layers at the surface of the active matter particles according to Equation (14):

$$\frac{d}{dt}R_{layer} = \pm \chi_{layer}|J_{para,z}| \quad (14)$$

wherein $\chi_{layer}$ is a functional quantity characteristic of the chemical composition of the parasitic layers formed at the surface of the electrodes by reactivity with the electrolyte. Sign +/− depends on the physico-chemical mechanism of development of the surface layer.

Thermal Balance

The temperature of the cell can be calculated as an output of the energy balance. On the one hand, the internal heat flux $\phi_{gen}$ generated by the electrochemical cell activity is given by:

$$\varphi_{gen}(t) = \sum_z J_z(t)\left(U_{eq,ref,z}(t) - T(t)\frac{dU_{eq,ref,z}(t)}{dT}\right)A_{(z)} - V(t)I(t) \quad (15)$$

where term $(U_{eq,ref,z}-V)$ can be associated with the irreversible losses for each electrochemical reaction z, whereas the reversible generation term $T\,dU_{eq,ref,z}/dT$ is directly related to the entropy variations due to the electrochemical reactions. On the other hand, the flux transferred to the ambient at temperature $T_a$, $\phi_{tra}$ is given by Fourier's law:

$$\varphi_{tra}(t) = hA_{cell}(T(t)-T_a) \quad (16)$$

where h is a thermal transfer coefficient associated with the convection and radiation phenomena, and $A_{cell}$ is the surface area of the cell. The net thermal flux through the battery, $\phi$, can be readily calculated as the difference between the internal and external fluxes, i.e. $\phi = \phi_{gen} - \phi_{tra}$. The amount of heat stored in the battery, obtained by integration of the heat flux in time, allows calculation of the temperature of the battery according to the relations:

$$M_{cell}C_p\frac{dT(t)}{dt} = \varphi_{gen}(t) - \varphi_{tra}(t) \quad (17)$$

where $C_p$ is the specific thermal capacity of the cell and $M_{cell}$ is the mass thereof.

Global Electrical Balance

The generic 0D electrochemical model is complemented by a global balance of the electric potential on the cell:

$$V(t,T) = \quad (18)$$
$$\Delta\Phi_{electrode,pos}(t,T) - \Delta\Phi_{electrode,neg}(t,T) + \sum_{i=1}^{N}\eta_{ci}(t,T) + \eta_\Omega(t,T)$$

where V(t,T) is the voltage at the cell terminals, $\eta_{ci}$ are concentration overvoltage terms and $\eta_\Omega$ is an ohmic overvoltage involving the internal resistance of the system, resulting from the conductivities of the solid and liquid phases. The ohmic resistance is a functional quantity characteristic of the system that takes the form of an exponential mathematical function.

To sum up, the 0D electrochemical model of the method according to the invention illustrated in FIG. 1 comprises Equations (1) to (18), that is a total at a minimum, as a function of the electrochemical reactions considered, of at least 16 equations for the 16 variables $J_{\&}, \ldots, J_n, \eta_1 \ldots \eta_n$, $[X]°_{pos}$ $[X]°_{neg}$ $\phi_{pos}, \phi_{neg}, Vr_{pos}, Vr_{neg}, \Delta\phi_{pos}, \Delta\phi_{neg}, \eta_1, \eta_n$ V, T.

The other quantities appearing in the equations that constitute the method are dealt with as parameters to be calibrated.

Definition of the state of charge according to the invention:

The state of charge of the cell in the method according to the invention, q(t), is given by the concentration of one of the reactive species X according to relation (19):

$$SOC(t) = \gamma + \delta\frac{[X]_t}{[X]_{max}} \quad (19)$$

wherein $\gamma$ and $\delta$ are functional quantities characteristic of the electrode materials.

This calculation is markedly distinguished from the calculation known in the prior art, referred to as "Coulomb counting", which gives:

$$\frac{dq(t)}{dt} = \frac{I(t)}{Q_{max}} \quad (20)$$

The relation between $X_{max}$ and $Q_{max}$ is given by:

$$Q_{max} = \kappa F[X]_{max} \quad (21)$$

wherein F is Faraday's constant and K is a functional quantity characteristic of the geometry of the limiting electrode.

The estimation of q is thus based on the estimation of X, whereas this variable is not directly measurable from a battery, in particular on board a vehicle.

Examples of Application to the Ni-MH and Li-Ion Technologies

1) Case of a Ni-MH Battery

In the case of a Ni-MH battery, diagrammatically shown in FIG. 2, the active species are nickel oxyhydroxide NiOOH, nickel hydroxide Ni(OH)$_2$, metal hydride MH, and oxygen O$_2$ partly dissolved in the electrolyte at equilibrium with the gas phase.

The electrochemical reactions at the positive electrode are, during discharge:

NiOOH+H$_2$O+e$^-$→Ni(OH)$_2$+OH$^-$ 0.5O$_2$+H$_2$O+e$^-$→2OH$^-$ \quad (22)

whereas, at the negative electrode:

MH+OH$^-$→H$_2$O+e$^-$+M

2OH$^-$→½O$_2$+H$_2$O+2e$^-$ \quad (23)

By applying Equation (2) to the four reactions (22)-(23), with z=1, ... 4, the following is:

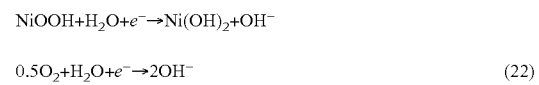

-continued $$J_3(t) = J_{3,0} \cdot \left\{ \left(\frac{c_m(t)}{c_{m,ref}}\right)^\mu \cdot \left(\frac{c_e}{c_{e,ref}}\right) \cdot e^{0.5 \cdot K \cdot \eta_3(t)} - e^{-0.5 \cdot K \cdot \eta_3(t)} \right\} \cdot$$
$$\exp\left(\frac{E_{a,3}}{R}\left(\frac{1}{T} - \frac{1}{T_0}\right)\right), \quad (26)$$

$$J_4(t) = J_{4,0} \cdot \left\{ \left(\frac{c_e}{c_{e,ref}}\right)^2 \cdot e^{1.5 \cdot K \cdot \eta_4(t)} - \left(\frac{c_o(t)}{c_{o,ref}}\right)^{1/2} \cdot e^{-0.5 \cdot K \cdot \eta_4(t)} \right\} \cdot$$
$$\exp\left(\frac{E_{a,4}}{R}\left(\frac{1}{T} - \frac{1}{T_0}\right)\right), \quad (27)$$

wherein $c_n$ is the concentration of the protons in the positive electrode (nickel hydroxide), $c_e$ is the concentration of the electrolyte, that is of the $OH^-$ ions, $c_o$ is the concentration of oxygen in the negative electrode and $\overline{C_o}$ is the interfacial oxygen concentration, at equilibrium with the gas phase, $c_m$ is the concentration of hydrogen in the negative electrode (metallic material), and subscripts "ref" and "max" relate to the reference and maximum values and finally, μ represents the reaction order.

Superpotentials $\eta_z$ are defined as:

$$\eta_1(t) = \phi_{pos}(t) - U_{eq,ref,1}(t)$$

$$\eta_2(t) = \phi_{pos}(t) - U_{eq,ref,2}(t)$$

$$\eta_3(t) = \phi_{pos}(t) - U_{eq,ref,3}(t)$$

$$\eta_4(t) = \phi_{pos}(t) - U_{eq,ref,4}(t) \quad (28)$$

where $\phi_{pos}$ and $\phi_{neg}$ are the solid-liquid potential differences at the positive and negative electrode respectively. Expressions for $U_{eq,ref,1}$, $U_{eq,ref,2}$, $U_{eq,ref,3}$ and $U_{eq,ref,4}$ as a function of temperature are known. For example, it is known:

$$U_{eq,ref,1} = \frac{k_1}{K(T)}(2\theta - 1) + U_1^0 + (T - T_0)\frac{dU_1}{dT} \quad (28a)$$

where θ is the SoC, $k_1$ a constant and $U_1$ is characterized by its derivative with respect to temperature T. Similarly, the parametrized expressions are known:

$$U_{eq,ref,z} = U_z^0 + (T - T_0)\frac{dU_z}{dT} \quad (28b)$$

for z=2, ..., 4.

2) Case of a Li-Ion Battery

In the case of a Li-ion battery, the active species are metal oxides for the positive electrode and carbon compounds, metals or metal oxides for the negative electrode. A Li-ion cell is diagrammatically shown in FIG. 3.

The electrochemical reactions at the positive electrode are, during charging:

$$Li_{1-x}MO_2 + xe^- + xLi^+ \rightarrow LiMO_2 \quad (29)$$

whereas, at the negative electrode, by taking the example of a carbon compound:

$$Li_yC_6 \rightarrow yLi^+ + 6C + ye \quad (30)$$

By applying Equation (2) to the two reactions (29)-(30), with z=1, ... 2, we obtain:

$$J_{ins,pos} = j_{0,ins,pos}\left\{\frac{\overline{C_{pos}}}{C_{pos,ref}} \times \left(\exp\left(\frac{\alpha_{ox,pos}F\eta_{pos}}{RT}\right)\right)\frac{C_{pos,max} - \overline{C_{pos}}}{C_{pos,max} - C_{pos,ref}} \times \right. \quad (31)$$
$$\left. \frac{C_e}{C_{e,ref}} \times \left(\exp\left(\frac{\alpha_{red,os}F\eta_{pos}}{RT}\right)\right)\right\}\exp\left(\frac{E_{a,pos}}{R}\left(\frac{1}{T} - \frac{1}{T_0}\right)\right)$$

$$J_{ins,neg} = j_{0,ins,neg}\left\{\frac{\overline{C_{neg}}}{C_{neg,ref}} \times \left(\exp\left(\frac{\alpha_{ox,neg}F\eta_{neg}}{RT}\right)\right)\frac{C_{neg,max} - \overline{C_{neg}}}{C_{neg,max} - C_{neg,ref}} \times \right. \quad (32)$$
$$\left. \frac{C_e}{C_{e,ref}} \times \left(\exp\left(\frac{\alpha_{red,neg}F\eta_{neg}}{RT}\right)\right)\right\}\exp\left(\frac{E_{a,neg}}{R}\left(\frac{1}{T} - \frac{1}{T_0}\right)\right)$$

wherein $c_{pos}$ is the concentration of the $Li^+$ ions in the positive electrode (metal oxide), $c_e$ is the concentration of the electrolyte, that is of the $Li^+$ ions, and $\overline{C_{pos}}$ variable is the interfacial charge carrier concentration, $c_{neg}$ is the concentration of the $Li^+$ ions in the negative electrode (insertion material generally based on graphite), whereas subscripts "ref" and "max" relate to the reference and maximum values respectively.

Superpotentials $\eta_z$ are defined as:

$$\eta_{pos} = \phi_{pos} - U_{eq,pos} - R_{SLI,pos} \times J_{pos}$$

$$\eta_{neg} = \phi_{neg} - U_{eq,neg} - R_{SLI,neg} \times J_{neg} \quad (33)$$

Expressions for $U_{eq,pos}$ and $U_{eq,neg}$ as a function of temperature are known:

$$U_{eq,pos} = 2.8 - 1.33x + 0.40\exp(-254x) - \quad (33a)$$
$$0.14\tanh(36.5(x - 0.033)) + (T - T_0)\frac{dU_{pos}}{dT}$$

$$U_{eq,neg} = 0.12 + 2.5\exp(-70x) - \exp(50(x - 1.04)) + (T - T_0)\frac{dU_{neg}}{dT} \quad (33b)$$

The table hereafter sums up the numerical values necessary for calibration of the reduced model according to the invention:

for a prismatic Ni-MH battery element of capacity 6.5 Ah, marketed by Panasonic, for a cylindrical Li-ion battery element of chemistry LFP/graphite and of capacity 2.3 Ah, marketed by A123 systems.

| T = 298K Polarity and electrode material | Ni-MH | | Li-ion | |
|---|---|---|---|---|
| | Electrode (+) NiOOH | Electrode (−) MH | Electrode (+) LiFePO$_4$ | Electrode (−) Carbon |
| J01, ins | 2.1 | 0 | 0.28 | 0 |
| J02, secondary | 8.0e−08 | 0 | 0 | 0 |
| J03, ins | 0 | 5.4 | 0 | 13.75 |
| J04, secondary | 0 | 1.5e−011 | 0 | 0 |
| $k_c$ | 0.0035 | 0 | 0 | 0 |
| $k_d$ | 0.0025 | 0 | 0 | 0 |
| $\beta_{electrode}$ | 1.0516 | 0.4834 | 1.03e+003 | 5.65 |
| $\Psi_{electrode}$ | 4.75e−010 | 0 | 3.73e−014 | 6.85e−012 |
| $D_s$ | 1e−014 | 1e−015 | 2.92e−020 | 2.50e−013 |
| $\Delta_{,electrode}$ | 0.0222 | 0.2059 | 0.74 | 0.028 |
| $\epsilon_{electrode}$ | 0.0903 | −0.3098 | 0.0033 | −0.39 |
| $h_{electrode,}$ | 1.5428e−004 | 0 | 0.0023 | 0.0023 |
| $\theta_{electrode,}$ | 0.0020 | −0.0638 | 0.0024 | −0.0112 |
| $\xi_{electrode,}$ | 0.0903 | −0.3098 | 307.09 | −2.5620 |
| $k_{electrod}$ | 1.7094e−004 | 0 | 0.0018 | 0.0021 |
| λ1 | 1.51e−005 | | 1.44e−011 | |

-continued

| T = 298K Polarity and | Ni-MH | | Li-ion | |
| --- | --- | --- | --- | --- |
| electrode material | Electrode (+) NiOOH | Electrode (−) MH | Electrode (+) LiFePO$_4$ | Electrode (−) Carbon |
| $\omega 1$ | 176.06 | | 1.81e+009 | |
| $R_{int}$ | 9.0e−04 | | 9.0e−03 | |
| $\gamma$ | 100 | | 102.11 | |
| $\Delta$ | −100 | | −126.58 | |
| Acell | 0.0083 | | 0.0063 | |
| Mcell | 0.166 | | 0.07 | |
| Cp | 2000 | | 1750 | |

Presentation of the Recursive Filter

The method advantageously uses a recursive filter for estimating the state of the dynamic system from the available measurements, diagrammatically shown in FIG. 4. Notable characteristics of this estimation problem are the fact that the measurements are affected by noise and that the modelled system according to the invention is highly non-linear. A recursive filter preferably used in the method is the known extended Kalman filter.

According to the model of the method, the state vector of the electrochemical battery cell (FIG. 4) is written: $x=\{c_n, c_m, p_o, \Delta\phi_{pos}, \Delta\phi_{neg}, T\}$, where the first component is related to the state of charge to be estimated by Equation (19). The measurements available are the voltage at the cell terminals and the temperature of the battery, which represent output y of the model, and current $I_{app}$ at the terminals, which represents input u of the model. According to the known recursive filter method, the equations of the model are reorganized into:

$$\dot{x} = f(x,u)$$

$$y = h(x,u) \quad (34)$$

SoC Estimation Algorithm

The method then provides a stage (M in FIG. 5) where the model gives the vector of variations f (F in FIG. 5) and the output y (Ye in FIG. 5) calculated according to Equation (34). These two variables are then handled in a second stage (Est in FIG. 5) that reconstructs state Xe from F, Ye, and measurement Y. The estimation algorithm thus uses the output of a third stage (FNL in FIG. 5) that provides variable L as a function of the reconstructed state, the characteristics of the electrochemical system (according to the model of the method) and the characteristics of the noise that affects the measurements. Stage FNL can be carried out with a method known to the person skilled in the art, the extended Kalman filter for example.

The reduced model directly represents the state of charge as a state variable of the model. On the other hand, known methods use models referred to as "equivalent electric circuit models" where the state of charge is not a dynamic variable of the model but an exogenous variable, as a function of which other dynamic or static variables are parametrized. It is understood that an electrochemical battery management system (BMS) using the method according to the invention to estimate the non-measurable characteristics of the battery from commonly available measurements will provide at the output more reliable and more precise information.

State of Health Estimation According to the Invention

The reduced model according to the invention is based on physical parameters of the system and not on equivalent global parameters such as the RC models known in the prior art. This property facilitates estimation of the aging and therefore of the state of health of the battery.

In fact, the methods used to estimate the state of charge, which are based on state observers, can be extended to involve a slow adaptation of the parameters of the model. This extension is known in the prior art for several different applications. In the case of the invention, the same signals that circulate in FIG. 4 can also be used for this adaptive extension.

The estimated variations of the parameters of the reduced model serve to detect possible macroscopic variations in the behavior of the battery, and therefore alterations in the performances thereof, which is commonly referred to as "aging". Aging recognition and quantification, through the relative variations of the parameters, gives the desired estimation of the state of health.

Electrical and Thermal Behavior Simulator

The 0D electrochemical model of the method according to the invention can calculate the variations over time of all the electrochemical variables internal to the battery, and in particular of the state of charge. Since the input of the model is the current at the battery terminals, the simulated cases depend on the selection of the latter variable. For example, a controlled charge or discharge can be represented at constant current, or variable current depending on the profile fixed, or variable current depending on the voltage. The latter case is representative of the battery draw conditions in a vehicle, where the current imposed on the battery depends on the voltage, according to the characteristics of the associated electric components (power electronics, electric motor(s), etc.). Typical electrical behavior prediction results obtained by a battery simulator using the models according to the invention are given in FIG. 6 for the case of the Ni-MH battery of Example 1 and in FIG. 7 for the case of the Li-ion battery of Example 2. In both cases, the comparison of the results of the 0D model of the method according to the invention with the experimental results underlines the accuracy of the rendering of the dynamic behavior obtained. In FIG. 6, the comparison with the results given by a reduced model of the prior art highlights the advantages provided by the use of the 0D model according to the invention.

The presence of the energy balance in the 0D model of the method according to the invention allows simulation of the thermal evolution of the system, coupled with the evolution of the electrical state given by Equation (18). Typical thermal behavior prediction results from a simulator using the models according to the invention are given in FIG. 8 for the case of the Ni-MH battery of Example 1 and in FIG. 9 for the case of the Li-ion battery of Example 2.

Consequently, the method according to the invention can thus serve for sizing of the battery, definition, calibration and validation of the electrical and thermal management strategies, and finally optimization of the thermal management systems with which the battery must necessarily be equipped. In fact, the generated thermal fluxes and the temperature of the battery are input variables for these systems, whose purpose is to adjust these fluxes and this temperature around allowable values.

The representation of the thermal transients permits synthesizing and validating the control and optimization strategies associated with the thermal management systems. These strategies can thus benefit from the presence of a reduced model during their on-line use, so as to have estimations of certain variables that are not measurable (temperatures at specific points, thermal fluxes, etc.), or that are measurable, but with too long of response times of the associated detectors.

Other Uses of the 0D Models of the Method

Vehicle System Simulator

The 0D model according to the invention is also useful as a sizing help tool for hybrid vehicle chain drives. An example of a hybrid vehicle system simulator integrating a battery model is given in FIG. 10. Typically, these applications require concentrated-parameter battery behavior models capable of simulating the dynamic behavior of a traction battery more efficiently and reliably than models of equivalent electric circuit type.

Impedance Spectroscopy Simulator

The 0D model of the method according to the invention allows reproduction of experimental impedance spectroscopy tests in order to predict the relations between these measurements and the internal state of charge of the battery. The potential equation is then modified to account for the inductive effects due to the connections between the cells and with the terminals.

$$V(t) = \Delta\Phi_{pos}(t) - \Delta\Phi_{neg}(t) + R_{int}I(t) + L_{ext}\frac{dI(t)}{dt} \quad (35)$$

This potentiality of the method according to the invention is illustrated in FIG. 11.

Sizing Method for Battery Production

Any battery production method based on a simulator of the electrical and thermal behavior of a battery will advantageously benefit from the 0D model of the method according to the invention, for its minimized calculating time, its reliability and precision as regards prediction of the characteristics of a battery. It is thus possible to implement a battery production method by dimensioning the battery with the method according to the invention.

The invention claimed is:

1. A method, utilizing a computer programmed with an electrochemical model, for estimating an internal state of a rechargeable electrochemical system and including electrodes, a separator, and an electrolyte, the method comprising:
   receiving at least one input signal of at least one parameter representative of a physical quantity of the system;
   providing a computer programmed with the electrochemical model of the system for calculating variations over time of internal electrochemical variables of the system on a basis of the at least one input signal; and
   estimating an internal state of the system by generating at least one output signal representing the internal electrochemical variables derived from calculating variations over time of the electrochemical variables of the rechargeable electrochemical system by applying the at least one input signal to the model; and wherein
   the electrochemical model includes a mathematical representation of kinetics of electrochemical reactions that take place at interfaces between the electrodes and the electrolyte accounting for interface concentrations; a mathematical representation of a spatial accumulation of charges in a double layer capacity at each electrode; a mathematical representation of a redistribution of charges at the electrodes; a mathematical representation of a diffusion of ionic charges of the electrolyte through the electrodes and the separator; a material balance of the electrodes and the electrolyte of the system; an energy balance of the system for calculating a temperature of the system; and homogenous parameters within the electrodes and the separator.

2. A method as claimed in claim 1, wherein the electrochemical model accounts for aging of the electrochemical system by determining a decrease in a maximum concentration of species stored in the electrodes and an increase in an internal resistance of the electrochemical system.

3. A method as claimed in claim 2, wherein the maximum concentration decrease $[X]_{max}$ is determined by the following:

$$\frac{d}{dt}[X]_{max} = -\chi_{electrode}|J_{para,z}|$$

wherein $\chi_{electrode}$ is a functional quantity characteristic of materials that make up each electrode, t represents time and $|J_{para,z}|$ represents a parasitic charge transfer current density for a reaction z.

4. A method as claimed in claim 2, wherein the Internal resistance increase $R_{layer}$ is determined by the following:

$$\frac{d}{dt}R_{layer} = \pm\chi_{layer}|J_{para,z}|$$

wherein $\chi_{layer}$ is a functional quantity characteristic of a chemical composition of parasitic layers formed at the surface of the electrodes by reactivity with the electrolyte, a sign +/− depends on physical-chemical mechanism of surface layer development, t represents time and $|J_{para,z}|$ represents a parasitic charge transfer current density for z which is a reaction.

5. A method as claimed in claim 3, wherein the Internal resistance increase $R_{layer}$ is determined by the following:

$$\frac{d}{dt}R_{layer} = \pm\chi_{layer}|J_{para,z}|$$

wherein $\chi_{layer}$ is a functional quantity characteristic of a chemical composition of parasitic layers formed at the surface of the electrodes by reactivity with the electrolyte, a sign +/− depends on physical-chemical mechanism of surface layer development, t represents time and $|J_{para,z}|$ represents a parasitic charge transfer current density for z which is a reaction.

6. A method as claimed in claim 1, wherein the rechargeable electrochemical system comprises a compartment for collecting gaseous species, and parameters are homogeneous within the compartment.

7. A method as claimed in claim 2, wherein the rechargeable electrochemical system also comprises a compartment for collecting gaseous species, and parameters are homogeneous within the compartment.

8. A method as claimed in claim 3, wherein the rechargeable electrochemical system also comprises a compartment for collecting gaseous species, and parameters are homogeneous within the compartment.

9. A method as claimed in claim 4, wherein the rechargeable electrochemical system also comprises a compartment for collecting gaseous species, and parameters are homogeneous within the compartment.

10. A method as claimed in claim 5, wherein the rechargeable electrochemical system also comprises a compartment for collecting gaseous species, and parameters are homogeneous within the compartment.

11. A method as claimed claim 1, wherein an interfacie concentration and a mean concentration are identified for active species in the electrochemical system.

12. A method as claimed in claim 1, wherein a thermodynamic equilibrium potential of the electrodes is described by a thermodynamic mathematical relation or by an analytical relation.

13. A method as claimed in claim 1, wherein the at least one input signal of at least one parameter representative of a physical quantity of the rechargeable electrochemical system is at least one of intensity, potential, temperature and required electrical power.

14. A method as claimed in claim 1, wherein at least one of potential, state of charge, state of health and the temperature of the electrochemical system is an output signal.

15. A method as claimed in claim 1, wherein voltage at the electrochemical system and temperature of the electrochemical system are output signals.

16. A method as claimed in claim 14, wherein the state of charge, the state of health and the temperature of the electrochemical system are recorded as output signals.

17. A method as claimed in claim 1 comprising the estimating an internal state of a rechargeable battery in an impedance spectroscopy simulator.

18. A method as claimed in claim 1, comprising estimating an internal state of a rechargeable battery for simulating thermal and electrical behavior of a traction battery of a hybrid or electrical vehicle, a photovoltaic energy plant or a wind power plant.

19. A method as claimed in claim 1 comprising:
estimating an internal state of a rechargeable battery for sizing of the rechargeable battery.

20. A system utilizing a computer programmed with an electrochemical model for estimating an internal state of a rechargeable electrochemical battery and including electrodes, a separator and an electrolyte for management of the electrochemical battery, comprising:
an input, coupled to a means for measuring at least one parameter representative of a physical quantity of the battery, for receiving at least one input signal representing the at least one parameter representative of a physical quantity of the battery;
at least one processor, for generating at least one output signal representative of at least one output representative of internal electrochemical variables, in response to receiving at least one input signal of at least one parameter representative of a physical quantity of the system, calculating variations over time of internal electrochemical variables of the system on a basis of the at least one input signal; and estimating the internal state of the system by generating the at least one output signal representative of the internal electrochemical variables derived from calculating variations over time of the electrochemical variables of the rechargeable electrochemical system by applying the at least one input signal to the model and controlling charge or discharge, and cooling of the battery in response to the output signal of the at least one processor; and wherein
the electrochemical model includes a mathematical representation of kinetics of electrochemical reactions that take place at interfaces between the electrodes and the electrolyte accounting for interface concentrations; a mathematical representation of a spatial accumulation of charges in a double layer capacity at each electrode; a mathematical representation of a redistribution of charges at the electrodes; a mathematical representation of a diffusion of ionic charges of the electrolyte through the electrodes and the separator; a material balance of the electrodes and the electrolyte of the system; an energy balance of the system for calculating a temperature of the system; and homogenous parameters within the electrodes and the separator.

21. A management system as claimed in claim 20 wherein the processing means comprises a recursive filter.

22. A system as claimed in claim 20 wherein the at least one processor is a recursive filter.

23. A system as claimed in claim 20 wherein the electrochemical battery is included in one of a hybrid or electrical vehicle, a photovoltaic or wind energy plant.

24. A system as claimed in claim 20 comprising a charger or discharger of the electrochemical battery.

25. A simulator of thermal and/or an electrical state of a battery utilizing a computer programmed with an electrochemical model for estimating an internal state of the battery including electrodes, a separator and an electrolyte, comprising:
an input, coupled to a means for measuring at least one parameter representative of a physical quantity of the battery, for receiving at least one input signal representing the at least one parameter representative of a physical quantity of the battery;
at least one processor, for generating at least one output signal representative of at least one output representative of internal electrochemical variables, a computer programmed with an electrochemical model for estimating an internal state of a rechargeable electrochemical system by receiving at least one input signal of at least one parameter representative of a physical quantity of the system, calculating variations over time of internal electrochemical variables of the system on a basis of the at least one input signal; and estimating an internal state of the system by generating at least one output signal of the internal electrochemical variables derived from calculating variations over time of the electrochemical variables of the rechargeable electrochemical system by applying the at least one input signal to the model and controlling charge or discharge, and cooling of the battery in response to the output signal of the at least one processor; and wherein
the electrochemical model includes a mathematical representation of kinetics of electrochemical reactions that take place at interfaces between the electrodes and the electrolyte accounting for interface concentrations; a mathematical representation of a spatial accumulation of charges in a double layer capacity at each electrode; a mathematical representation of a redistribution of charges at the electrodes; a mathematical representation of a diffusion of ionic charges of the electrolyte through the electrodes and the separator; a material balance of the electrodes and the electrolyte of the system; an energy balance of the system for calculating a temperature of the system; and homogenous parameters within the electrodes and the separator.

* * * * *